United States Patent
Denning et al.

(10) Patent No.: US 10,436,854 B2
(45) Date of Patent: Oct. 8, 2019

(54) POWER SUPPLY ARRANGEMENT

(71) Applicant: Viper Innovations Limited, Bristol (GB)

(72) Inventors: Dan Denning, Bristol (GB); Steve Simpson, Bristol (GB); Paul Robert Overton, Somerset (GB)

(73) Assignee: Viper Innovations Limited, Bristol (GB)

( * ) Notice: Subject to any disclaimer, the term of this patent is extended or adjusted under 35 U.S.C. 154(b) by 156 days.

(21) Appl. No.: 15/417,096

(22) Filed: Jan. 26, 2017

(65) Prior Publication Data

US 2017/0227612 A1     Aug. 10, 2017

(30) Foreign Application Priority Data

Feb. 8, 2016   (GB) .................................. 1602226.1

(51) Int. Cl.
| | |
|---|---|
| *G01R 31/40* | (2014.01) |
| *H02J 3/00* | (2006.01) |
| *G01R 31/42* | (2006.01) |

(52) U.S. Cl.
CPC ............. *G01R 31/40* (2013.01); *G01R 31/42* (2013.01); *H02J 3/00* (2013.01)

(58) Field of Classification Search
CPC ............ G01R 31/40; G01R 31/42; H02J 3/00
See application file for complete search history.

(56) References Cited

U.S. PATENT DOCUMENTS

| | | | |
|---|---|---|---|
| 3,813,667 A | 5/1974 | Smith | |
| 4,138,669 A * | 2/1979 | Edison | H04Q 9/14 340/3.31 |
| 4,140,965 A | 2/1979 | Neal | |
| 4,926,425 A * | 5/1990 | Hedtke | G06F 11/221 714/732 |
| 5,255,208 A | 10/1993 | Thakore et al. | |
| 5,448,491 A | 9/1995 | Janke et al. | |
| 5,602,462 A | 2/1997 | Stich et al. | |
| 5,652,754 A * | 7/1997 | Pizzica | G06F 11/277 714/44 |
| 5,710,701 A * | 1/1998 | Brown | G01R 31/40 324/764.01 |
| 5,727,000 A * | 3/1998 | Pizzica | G01R 31/3177 714/732 |
| 7,236,368 B2 * | 6/2007 | Maxwell | H05K 1/0203 174/15.2 |

(Continued)

FOREIGN PATENT DOCUMENTS

| | | |
|---|---|---|
| EP | 0024661 | 3/1981 |
| EP | 2555004 | 2/2013 |

(Continued)

*Primary Examiner* — Tung X Nguyen
*Assistant Examiner* — Dominic E Hawkins
(74) *Attorney, Agent, or Firm* — Wells St. John P.S.

(57) ABSTRACT

A power supply arrangement is described that comprises a power supply module 10 including a supply connector 14 and an output connector 16, and an electrical circuit 18 interconnecting the supply connector 14 and the output connector 16, the electrical circuit 18 including a test point 30 to which a test module 36 may be connected, the test point 30 being electrically connected to the output connector 16.

18 Claims, 1 Drawing Sheet

(56) References Cited

U.S. PATENT DOCUMENTS

| | | | |
|---|---|---|---|
| 8,476,964 B1* | 7/2013 | Atri | H02M 3/07 |
| | | | 327/536 |
| 8,520,349 B2 | 8/2013 | Billingsley et al. | |
| 9,166,396 B2 | 10/2015 | Billingsley et al. | |
| 9,529,058 B2* | 12/2016 | Bulur | G01R 31/025 |
| 2011/0000677 A1* | 1/2011 | Overfield | E21B 33/0355 |
| | | | 166/336 |
| 2011/0298467 A1* | 12/2011 | Douglas | E21B 41/0007 |
| | | | 324/509 |
| 2012/0065922 A1* | 3/2012 | Puchianu | G01R 31/2846 |
| | | | 702/123 |
| 2012/0194955 A1 | 8/2012 | Billingsley et al. | |
| 2012/0221161 A1 | 8/2012 | Billingsley et al. | |
| 2013/0054165 A1 | 2/2013 | Ramirez | |
| 2013/0073232 A1 | 3/2013 | Billingsley et al. | |
| 2013/0258538 A1 | 10/2013 | Billingsley et al. | |
| 2014/0005963 A1 | 1/2014 | Dawley et al. | |
| 2014/0062201 A1 | 3/2014 | Giuntini et al. | |
| 2014/0340111 A1 | 11/2014 | Mercadal et al. | |
| 2015/0198651 A1* | 7/2015 | Overton | G01R 31/083 |
| | | | 324/527 |
| 2016/0053587 A1* | 2/2016 | Eriksen | E21B 33/0355 |
| | | | 166/65.1 |
| 2016/0245051 A1* | 8/2016 | Askeland | E21B 43/128 |

FOREIGN PATENT DOCUMENTS

| | | |
|---|---|---|
| EP | 2680014 | 1/2014 |
| EP | 2950112 | 12/2015 |
| GB | 1602226.1 | 8/2016 |
| GB | 1701165.1 | 5/2017 |

* cited by examiner

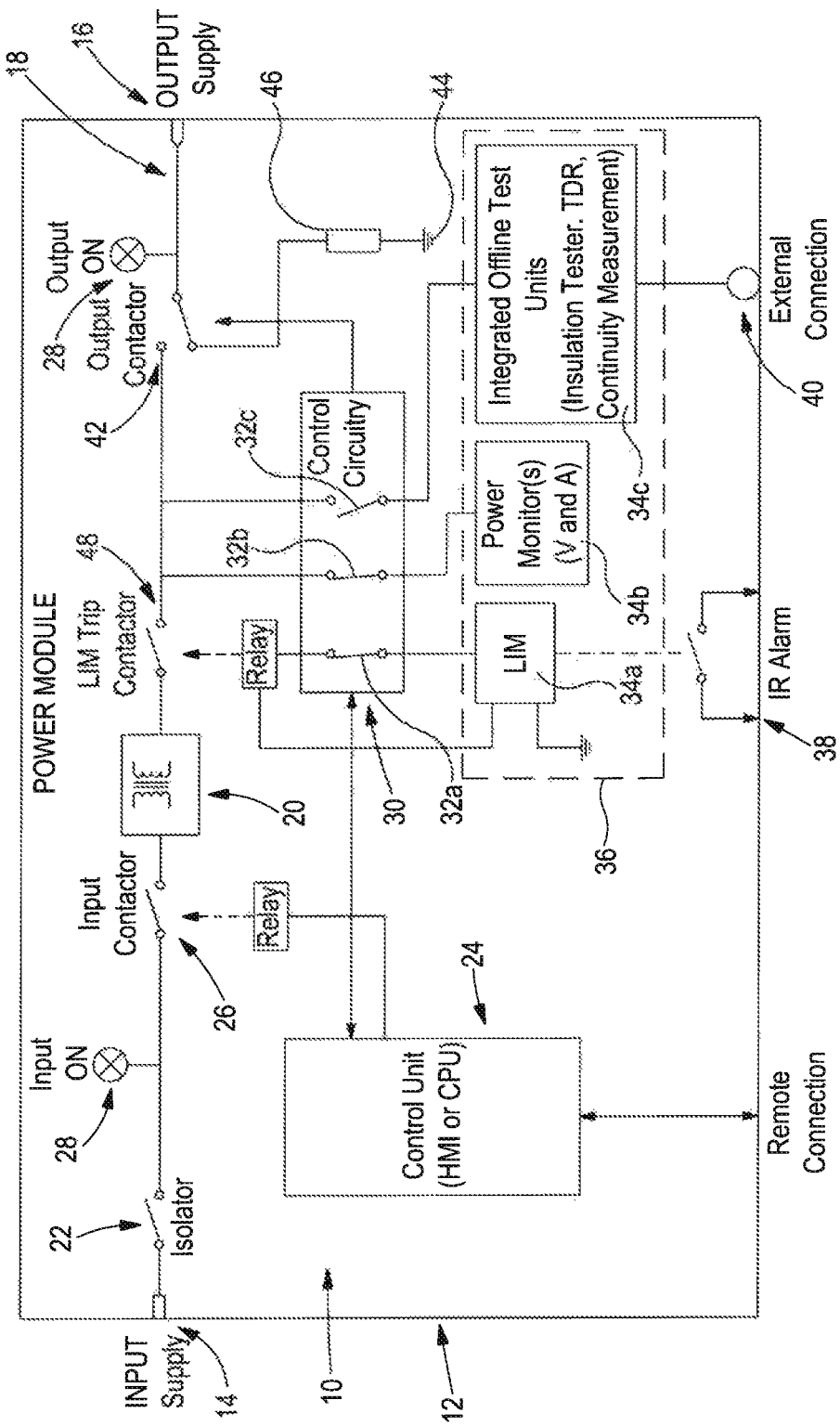

POWER SUPPLY ARRANGEMENT

RELATED PATENT DATA

This application claims priority to GB Patent Application No. 1602226.1, which was filed on 8 Feb. 2016, the teachings of which are incorporated herein by reference.

This invention relates to a power supply arrangement for use in the supply, and in controlling the supply, of electrical power to subsea located equipment such as is used in the production of hydrocarbons from subsea located wells and the like. In particular, the invention relates to an arrangement including a power supply module and incorporating test functionality allowing tests to be conducted upon the subsea located equipment and/or lines by which electrical power is supplied thereto.

In a typical system, a power supply module is used to supply electrical power to subsea located equipment. By way of example, the power supply module may incorporate an electrical transformer whereby an input supply can be converted to an output voltage controlled to be at a level suitable for use in operating the equipment connected to the power supply module. When it is required to conduct tests on the subsea located equipment or the umbilical or other lines by which electrical power is supplied thereto, the power supply module is physically disconnected from the umbilical or the like and instead a test module is connected thereto to allow the tests to be undertaken. After completion of the tests, the test module is physically disconnected from the umbilical or the like and the power supply module is reconnected thereto.

As, when the tests are undertaken, the power supply module is disconnected from the umbilical or the like, whilst the test module is able to undertake tests on the umbilical and the equipment, or at least some of the equipment, connected thereto, the tests conducted on the umbilical do not cover any part of the power supply module. Separate tests would be required to achieve this. Even where such separate tests are conducted, the presence of protection devices such as relay energised contactors may prevent parts of the power supply module from being tested. Accordingly, as a result of the limitations of the test procedures, the output of the test module may not be as accurate as desired, as faults may be present that go undetected as a consequence of the test module being unable to undertake tests on the faulty part of the system.

The tests require a break to be made in the circuit under test in order to connect the test equipment thereto, typically achieved by disconnection of the umbilical or the like from the output connector of the power supply module as mentioned above. The physical disconnection of the power supply module from the umbilical or the like, and the subsequent connection of the test module, and the subsequent disconnection of the test module and reconnection of the power supply module, potentially runs the risk of damage to the connectors used in making up the various connections. More importantly, the steps of disconnecting and reconnecting the umbilical require suitably qualified technicians to be present on site to conduct the tests, resulting in testing being undertaken relatively infrequently as the time and cost associated with the mobilisation of technicians to the site, which is typically offshore, makes frequent testing uneconomic. Furthermore, the technicians may be exposed to high voltages when the umbilical is disconnected from the power supply module, and the disconnection of the umbilical from the power supply unit potentially exposes the test technician to dangerous stored charges, and so presents safety concerns. Commonly, in order to provide redundancy, two like systems are provided in close proximity. While one of the systems is being tested, the other is live. The test technician may thus be required to work in close proximity to potentially dangerous high voltages.

Accordingly, the need to break and remake connections in order to conduct tests is undesirable.

It is an object of the invention to provide a power supply arrangement in which at least some of the disadvantages set out above are overcome or are of reduced effect.

According to the present invention there is provided a power supply arrangement comprising a power supply module including a supply connector and an output connector connectable, in use, to an electrical demand, and an electrical circuit interconnecting the supply connector and the output connector, the electrical circuit including a test point to which a test module is connected or connectable, the test point being electrically connected to the output connector so that a test module connected to the test point, in use, is able to conduct tests on parts of the power supply module downstream of the test point and upon the demand connected to the output connector.

The test module and the power supply module are conveniently located within a common housing, the test point preferably taking the form of a switch whereby a circuit of the test module can be electrically connected to a part of the electrical circuit of the power supply module electrically connected to the output connector.

It will be appreciated that in such an arrangement, in order to conduct tests, there is no need for the output connector of the power supply module to be disconnected from the electrical demand, for example, in the form of an umbilical or the like. Instead, the connection at the output connector from the power supply module can remain intact. As a result, the tests can include testing the integrity of this connection and other parts of the supply module as well as the integrity and/or functionality of the umbilical or the like or equipment connected thereto. Furthermore, the risk of damage or faults arising through the need to repeatedly make and break connections at the output connector is reduced. Also, safety concerns associated with test technicians potentially being exposed to high voltages are avoided, and the time and costs associated with the need for test technicians to attend the site to undertake the test may be removed.

As an alternative to incorporating the test module within the same housing as the power supply module, a separate test module may be used. Preferably, the power supply module includes, in such an arrangement, a socket at the test point to which the test module can be connected. Again, such an arrangement allows testing of the connection at the output connector, and avoids making and breaking of connections at the output connector. Many of the benefits set out hereinbefore continue to apply in such an arrangement.

The invention will further be described, by way of example, with reference to the accompanying drawing, FIG. 1, which is a diagrammatic view illustrating a power supply arrangement in accordance with an embodiment of the invention.

Referring to FIG. 1, a power supply arrangement is illustrated, the arrangement including a power supply module 10. The module 10 comprises a housing 12 including a supply connector 14 whereby electrical power is supplied from an external power supply (not shown) to the power supply module 10, and an output connector 16 connected, in use, to a demand, for example in the form of an umbilical or other line, whereby electrical power is supplied from the power supply module 10 to subsea located equipment or the like. If desired, a power conditioning unit (not shown) may be incorporated between the external power supply and the power supply module 10, to clean the supply thereto and to provide Galvanic isolation of the power supply module 10 from the supply.

Within the power supply module 10 is provided an electrical power supply circuit 18, providing an electrical connection between the supply connector 14 and the output connector 16. The power supply circuit 18 includes a transformer 20, a manually operable isolation switch 22, and a control unit 24 operable to control the operation of an input contactor or switch 26, controlling the supply to the transformer 20. The control unit 24 conveniently further controls the operation of an output interface such as a display (not shown) whereby aspects of the operation of the arrangement may be output to an operator. In addition, the circuit 18 conveniently includes indicator lights 28, providing indications that the power supply module 10 is switched on and providing an output to the output connector 16.

The power supply circuit 18 further includes a test point 30. In the arrangement illustrated, the test point 30 takes the form of a series of switches 32a, 32b, 32c each of which is controllable in such a fashion as to control the electrical connection of a respective test circuit 34a, 34b, 34c of a test module 36 to the circuit 18 and the output connector 16. In the arrangement illustrated, the switches 32a, 32b, 32c of the test point 30 are controlled by the control unit 24.

As illustrated, the test module 36 is conveniently located within the housing 12 of the power supply module 10, and the display associated with the control unit 24 is preferably operable in response to an output from the test module 36 to provide an indication of the output of the tests conducted thereby, in use.

In the arrangement illustrated, the test circuit 34a takes the form of a line insulation monitoring unit, and the test circuit 34b takes the form of a power monitoring unit comprising, for example, a voltmeter, an ammeter and a power analysis circuit. The line insulation monitoring unit conveniently controls the operation of an alarm 38 operable in the event that an unacceptably low line insulation resistance level is detected. Circuit 34c may be operable using, for example, time domain reflectometry (TDR), spread spectrum TDR, or may be operable to test insulation or electrical continuity, or the like. As illustrated, an electrical connection 40 may be provided to allow the auxiliary connection of other test equipment, if desired. These are merely examples of the type of off-line test circuits that may be provided, and other circuits could be provided without departing from the scope of the invention.

The power supply circuit 18 further comprises an output contactor or switch 42, controllable by the control unit 24, operable to control the connection of the output connector 16 to the transformer 20, and also to control the connection between the output connector 16 and a ground connection 44, to allow electrical discharge from the umbilical or the like connected to the output connector 16 to ground via a load bank 46.

As an additional safeguard, as illustrated, an isolation contactor or switch 48 is provided in the power supply circuit 18, the switch 48 being controlled by the test circuit 34a. In the event that the test circuit 34a which is arranged to monitor line insulation detects that insulation resistance has dropped below a predetermined threshold, then the test circuit 34a operates to open the switch 48 and thereby interrupt the supply from the arrangement.

In normal use, when no tests are being undertaken, the switches 22, 26 will be closed, so electrical power from the input connector 14 is supplied to the transformer 20. The isolation switch 48 is also closed (provided the insulation resistance of the system as determined by the line insulation monitoring test circuit 34a) is above the predetermined threshold. The output switch 42 is positioned such that the output from the transformer 20 is supplied to the output connector 16. Electrical power is thus supplied from the transformer 20 to the output connector 16 and to an umbilical or the like, and associated equipment, connected thereto, and the output indicator light 28 will be illuminated to indicated that the output from the arrangement is live. In this mode of operation, the control unit 24 controls the switches 32a, 32b, of the test point 30 in such a fashion that they are closed, so that 'live' line insulation monitoring to monitor the system insulation resistance, and 'live' power monitoring can be undertaken by the test circuits 34a, 34b.

The control unit 24 controls the switch 32c of the test point 30 so as to be open. No testing is undertaken by the test circuit 34c of the test module 36, and the test circuit 34c is isolated from the power supply circuit 18, and from the high voltage supplied via the power supply circuit 18 to the output connector 16. During this mode of operation, the indicator lights 28 will be illuminated, showing that the module 10 is connected to a live supply, and that power is being supplied via the output connector 16 to the umbilical or the like connected thereto. The outputs of the 'live' tests may be displayed on the display controlled by the control unit 24.

When off-line tests are to be conducted by the test circuit 34c, the control unit 24 is operated to open the switch 26, thereby interrupting the high voltage output to the output connector 16. As the output of the power supply unit 10 is interrupted, the output indicator lamp 28 will switch off, confirming that the output has been interrupted. Subsequently, the switch 32c of the test point 30 may be closed, under the control of the control unit 24, to allow the test circuit 34c of the test module 36 to undertake one or more tests on the power module 10 and the umbilical or the like connected to the output connector 16. When tests are being conducted using the test circuit 34c, the switches 32a, 32b will be opened by the control unit 24 to isolate the test circuits 34a, 34b and thereby protect these circuits from the high voltages that may be applied during the off-line tests. The tests undertaken by the test circuit 34c may include, for example insulation resistance tests, TDR based tests or the like as mentioned hereinbefore. The precise nature of the tests undertaken by the test circuit 34c is not of relevance to the invention and so the manner in which they are conducted will not be described herein in detail. The output of the tests may be indicated to an operator by way of the display controlled by the control unit 24.

Depending upon the nature of the tests to be undertaken, it may be necessary to temporarily connect the umbilical or the like to ground, and this may be achieved by appropriate control over the output switch 42, under the control of the control unit 24. After discharge, the output switch 42 may again be adjusted to allow the required tests to be conducted using the test module 36.

After completion of the tests, the control unit 24 disconnects the test circuit 34c of the test module 36 from the circuit 18, reconnects the test circuits 34a, 34b thereto, and controls the operation of the switches 26, 42 such that the supply of electrical power to the umbilical or the like recommences.

Whilst not illustrated, the control unit 24 may be operable to connect together or isolate certain of the conductors of the umbilical or the like connected to the output connector 16 to allow certain tests to be conducted.

The control unit 24 may be controlled by, for example, a control panel provided on the housing 12. Alternatively, it may be arranged to be controlled from a remote location, for example via an internet connection. When used in this fashion, the outputs of the tests may also be supplied to the remote location. Accordingly, the tests may be undertaken in an automated fashion from the remote location, if desired, requiring little or no input at the location of the power supply module 10.

The arrangement described hereinbefore is advantageous in that tests can be undertaken without the need to disconnect the power supply module 10 from the umbilical or the like under test. As a result, parts of the power supply module 10, including the connection to the umbilical or the like can be subject to the tests, and the likelihood of damage to the output connector 16 and corresponding connector of the umbilical can be reduced.

The tests can, if desired, be undertaken from a remote location. As a result, the time and costs associated with the need for a test technician to attend the site, which is typically offshore, in order for tests to be conducted can be saved. The tests can thus be undertaken more quickly and efficiently, leading to reduced down-time. As a result of the reduction in cost and the avoidance of the need for technicians to attend the site to conduct tests, the tests may be undertaken more regularly.

As the tests do not require breaking of connections, and in particular no high voltage connections need to be made or broken during testing, tests do not carry the same health and safety concerns as apply with conventional test regimes. Furthermore, technicians are not exposed to potentially dangerous stored charges in the umbilical or other lines as may be the case if connections have to be broken as in the traditional test regimes. There is also no need for technicians to be working in close proximity to other live systems.

Clearly, as set out above, the invention is particularly beneficial in that the costs and travel times associated with the need for test technicians to attend the site are saved, and the safety risks associated with conducting the tests are reduced or avoided. These benefits are achieved without negatively impacting upon the accuracy and usefulness of the test results. Indeed, as the invention allows tests to be conducted upon at least parts of the power supply module, the arrangement of the invention achieves the above noted benefits whilst also permitting enhanced test accuracy to be achieved.

Whilst in the arrangement described hereinbefore the test module 30 is located within the power supply module 10, arrangements are also possible in which the test module 30 is a separate component, for example connected to the circuits of the power supply module 10 at the test point 30 using, for example, suitable plug and socket connectors.

Although the description hereinbefore and associated drawing relate to one specific embodiment of the invention, it will be understood that a wide range of modifications and alterations may be made thereto without departing from the scope of the invention as defined by the appended claims.

The invention claimed is:

1. A surface power supply arrangement for providing power to subsea located electrical equipment comprising a power supply module including a supply connector for receiving electrical power supplied from an external power supply and an output connector connectable, in use, to subsea located electrical equipment to provide power thereto, and an electrical circuit interconnecting the supply connector and the output connector, the electrical circuit including a test point to which a plurality of test circuits are connected or connectable, in which each test circuit is configured to carry out a different test on the subsea located electrical equipment or an umbilical line, the test point being electrically connected to the output connector so that a test module connected to the test point, in use, is able to conduct tests on parts of the power supply module downstream of the test point and upon the subsea located electrical equipment or umbilical line connected to the output connector, and wherein the power supply arrangement further comprises an external connection connectable to test equipment external to the power supply arrangement.

2. An arrangement according to claim 1, wherein at least one of the plurality of test circuits and the power supply module are located within a common housing.

3. An arrangement according to claim 1, wherein at least one of the plurality of test circuits and the power supply module are located within separate housings.

4. An arrangement according to claim 1, wherein the test point takes the form of at least one switch whereby at least one of the plurality of test circuits can be electrically connected to a part of the electrical circuit of the power supply module electrically connected to the output connector.

5. An arrangement according to claim 4, further comprising a control unit operable to control the at least one switch.

6. An arrangement according to claim 5, wherein the control unit further controls the operation of a switch controlling the supply of electrical power between the input connector and the output connector.

7. An arrangement according to claim 5, wherein the control unit further controls the operation of an output switch.

8. An arrangement according to claim 5, wherein the control unit is controllable using a control panel provided upon the power supply module.

9. An arrangement according to claim 5, wherein the control unit is remotely controllable.

10. An arrangement according to claim 1, further comprising an isolation switch operable by the test module to interrupt the supply of electrical seal power between the supply connector and the output connector.

11. An arrangement according to claim 1, in which the plurality of test circuits comprise one or more of a line insulation monitoring unit, a power monitoring unit a time domain reflectometry measurement unit, a spread spectrum measuring unit, an electrical continuity monitoring unit.

12. An arrangement according to claim 11, wherein at least one of the plurality of test circuits is interchangeable with another test circuit.

13. An arrangement according to claim 1, wherein the plurality of test circuits include at least one high voltage test circuit configured to carry out a high voltage test on the subsea located electrical equipment.

14. An arrangement according to claim 13, wherein at least some of the plurality of test circuits are isolated from the high voltage test circuit when the high voltage test circuit is connected to the test point.

15. An arrangement according to claim 1, wherein at least one of the plurality of test circuits are on-line test circuits configured to carry out tests when the power is connected to the output connector, and wherein at least one of the plurality of test circuits is an off-line test circuit configured to carry out tests when power from the power supply module is isolated from the subsea located electrical equipment.

16. An arrangement as claimed in claim 1, wherein the external connection is in electrical communication with the test point.

17. A subsea system comprising subsea located electrical equipment testing arrangement in which the subsea located electrical equipment is powered by a remote power supply arrangement, wherein the power supply arrangement comprises:

a power supply module including a supply connector for receiving electrical power supplied from an external power supply and an output connector connectable, in use, to subsea located electrical equipment to provide power thereto, and an electrical circuit interconnecting the supply connector and the output connector, the electrical circuit including a test point to which a plurality of test circuits are connected or connectable, in which each test circuit is configured to carry out a different test on the subsea located electrical equipment or an umbilical line, the test point being electrically connected to the output connector so that a test module connected to the test point, in use, is able to conduct tests on parts of the power supply module downstream of the test point and upon the subsea located electrical equipment or umbilical line connected to the output connector, and wherein the power supply arrangement further comprises an external connection connectable to test equipment external to the power supply arrangement.

18. A subsea system as claimed in claim 17, wherein the external connection is in electrical communication with the test point.

* * * * *